United States Patent
Ha

(10) Patent No.: US 11,849,058 B2
(45) Date of Patent: Dec. 19, 2023

(54) FOLDABLE DISPLAY DEVICE AND MANUFACTURING METHOD THEREOF

(71) Applicant: SAMSUNG DISPLAY CO., LTD., Yongin-si (KR)

(72) Inventor: Seung Hwa Ha, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 79 days.

(21) Appl. No.: 17/495,376

(22) Filed: Oct. 6, 2021

(65) Prior Publication Data

US 2022/0030097 A1    Jan. 27, 2022

Related U.S. Application Data

(63) Continuation of application No. 16/686,334, filed on Nov. 18, 2019, now Pat. No. 11,158,834.

(30) Foreign Application Priority Data

Dec. 28, 2018   (KR) .................. 10-2018-0172360

(51) Int. Cl.
    *H05K 5/02*     (2006.01)
    *H04M 1/02*     (2006.01)
    (Continued)

(52) U.S. Cl.
    CPC ............ *H04M 1/0214* (2013.01); *G09G 5/14* (2013.01); *H04M 1/0268* (2013.01); *H05K 5/0017* (2013.01); *H10K 50/841* (2023.02); *H10K 50/86* (2023.02); *H10K 59/40* (2023.02); *H10K 71/00* (2023.02); *H10K 71/80* (2023.02); *G06F 3/041* (2013.01); *G06F 2203/04102* (2013.01);
    (Continued)

(58) Field of Classification Search
    CPC . H04M 1/0214; H05K 5/0017; H05K 5/0217; H01L 51/003; H01L 51/524; H01L 51/5281
    USPC ........................................... 361/809
    See application file for complete search history.

(56) References Cited

U.S. PATENT DOCUMENTS

| 5,656,526 A | 8/1997 | Inada et al. |
| 6,157,433 A | 12/2000 | Kashimoto et al. |
| (Continued) | | |

FOREIGN PATENT DOCUMENTS

| CN | 101118714 A | 2/2008 |
| CN | 101154342 A | 4/2008 |
| (Continued) | | |

OTHER PUBLICATIONS

Partial European Search Report for Application No. 19217540.4 dated Apr. 3, 2020.

*Primary Examiner* — Hung S. Bui
(74) *Attorney, Agent, or Firm* — CANTOR COLBURN LLP

(57) ABSTRACT

A display device includes a first display part, a second display part, and a third display part provided between the first display part and the second display part. One of the first display part and the second display part is transparent, and the other of the first display part and the second display part is opaque. The third display part comprises a transparent part and an opaque part, which are mixed therein, and an area ratio of the transparent part and the opaque part in the third display part is gradually changed.

9 Claims, 10 Drawing Sheets

(51) Int. Cl.
  G09G 5/14 (2006.01)
  H05K 5/00 (2006.01)
  H10K 50/86 (2023.01)
  H10K 50/84 (2023.01)
  H10K 59/40 (2023.01)
  H10K 71/00 (2023.01)
  H10K 71/80 (2023.01)
  G06F 3/041 (2006.01)
  H10K 50/844 (2023.01)
  H10K 59/12 (2023.01)
  H10K 102/00 (2023.01)

(52) U.S. Cl.
  CPC ....... *G09G 2380/02* (2013.01); *H10K 50/844* (2023.02); *H10K 59/12* (2023.02); *H10K 59/1201* (2023.02); *H10K 2102/311* (2023.02)

(56) References Cited

U.S. PATENT DOCUMENTS

| | | | |
|---|---|---|---|
| 7,898,641 B2 | 3/2011 | Matsuoka et al. | |
| 7,978,274 B2 | 7/2011 | Umezaki et al. | |
| 10,042,391 B2 | 8/2018 | Yun et al. | |
| 10,263,217 B2 | 4/2019 | Lee et al. | |
| 10,509,560 B2 | 12/2019 | Kim et al. | |
| 10,510,813 B2 | 12/2019 | Son et al. | |
| 10,796,613 B2 | 10/2020 | Xu et al. | |
| 2004/0207798 A1 | 10/2004 | Tak et al. | |
| 2008/0048953 A1 | 2/2008 | Koh et al. | |
| 2009/0295731 A1 | 12/2009 | Kim et al. | |
| 2011/0148797 A1 | 6/2011 | Huitema et al. | |
| 2016/0179236 A1 | 6/2016 | Shin et al. | |
| 2016/0381812 A1 | 12/2016 | Dong | |
| 2017/0040562 A1 | 2/2017 | Kim et al. | |
| 2017/0108718 A1 | 4/2017 | Park et al. | |
| 2017/0139513 A1* | 5/2017 | Hong | H10K 59/131 |
| 2017/0200915 A1 | 7/2017 | Lee et al. | |
| 2017/0278900 A1 | 9/2017 | Yang et al. | |
| 2017/0358252 A1 | 12/2017 | Bhageria et al. | |
| 2018/0217435 A1 | 8/2018 | Jin et al. | |
| 2019/0036068 A1* | 1/2019 | Kim | H10K 59/87 |
| 2019/0097178 A1 | 3/2019 | Cho et al. | |

FOREIGN PATENT DOCUMENTS

| | | |
|---|---|---|
| CN | 207381404 U | 5/2018 |
| CN | 108254954 A | 7/2018 |
| KR | 1020160080467 A | 7/2016 |
| KR | 1020170016557 A | 2/2017 |
| KR | 1020170049146 A | 5/2017 |
| KR | 1020170077434 A | 7/2017 |
| KR | 1020170084402 A | 7/2017 |
| KR | 1020180111281 A | 10/2018 |

\* cited by examiner

FOLDABLE DISPLAY DEVICE AND MANUFACTURING METHOD THEREOF This application is a divisional of U.S. patent application Ser. No. 16/686,334, filed on Nov. 18, 2019, which claims priority to Korean patent application 10-2018-0172360, filed on Dec. 28, 2018, and all the benefits accruing therefrom under 35 U.S.C. § 119, the content of which in its entirety is herein incorporated by reference.

BACKGROUND

1. Field

The disclosure generally relates to a foldable display device and a manufacturing method thereof.

2. Related Art

An electronic device such as a smart phone or a tablet personal computer ("PC") may have a transparent display. The transparent display is a display that enables a user to view another surface (e.g., a back surface) thereof through one surface (e.g., a front surface) thereof. That is, in the transparent display, an object located at the back surface is projected onto the front surface.

Also, the electronic device may have a foldable display device in which a screen can be folded into a plurality of parts. The foldable display device may be, for example, a flexible display device. In the foldable display device, a glass substrate typically provided in a display panel may be replaced with a plastic film, thereby providing flexibility to the display device.

SUMMARY

Embodiments provide a foldable display device includes a transparent part and an opaque part and is manipulated by a folding operation.

According to an embodiment of the disclosure, a display device includes: a first display part; a second display part; and a third display part disposed between the first display part and the second display part, where one of the first display part and the second display part is transparent, and the other of the first display part and the second display part is opaque, where the third display part includes a transparent part and an opaque part, which are mixed therein, and an area ratio of the transparent part with the opaque part in the third display part is gradually changed.

In an embodiment, the area ratio of the transparent part with the opaque part in the third display part may be gradually increased or decreased toward the second display part from the first display part.

In an embodiment, the third display part may include a boundary surface between the first display part and the second display part, and the boundary surface may have a shape of one of a mosaic, a zigzag, a curve, and a wave.

In an embodiment, the first display part and the second display part may be simultaneously or individually driven to display a same image as each other or different images from each other, in response to a folding state of the display device.

In an embodiment, the folding state of the display device may be sensed in a region of at least one of the first display part, the second display part, and the third display part.

In an embodiment, the first display part may include an edge portion, which is curved and opposite to the third display part.

In an embodiment, an entire area of the first display part including the edge portion may be larger than an entire area of the second display part.

In an embodiment, when the first display part and the second display part overlap each other through folding the third display part, the edge portion of the first display part may cover an edge portion of the second display part, which is opposite to the third display part.

In an embodiment, each of the first display part and the second display part may include: a base layer; a display panel disposed on the base layer, where the display panel displays an image; and a window layer disposed on the display panel.

In an embodiment, the first display part may further include an input sensing layer disposed between the display panel and the window layer, where the input sensing layer senses an external input.

In an embodiment, the first display part may further include an input sensing layer disposed on a bottom surface of the base layer, where the input sensing layer senses an external input.

In an embodiment, the first display part may further include a polarizing layer disposed between the display panel and the window layer, where the polarizing layer decreases a reflectivity of light incident from an outside.

In an embodiment, when the first display part is disposed to overlap the second display part on the second display part through folding the third display part, the first display part may display an image by decreasing at least one of a resolution of the image and a size of the image.

In an embodiment, the first display part may further include a lower protective layer disposed on a bottom surface of the base layer.

In an embodiment, the first display part and the second display part may be flexible or rigid.

In an embodiment, the display device may further include a substrate of a display part, which is rigid and disposed on a bottom surface of the base layer.

In an embodiment, when both the first display part and the second display part are rigid, the third display part may include a coupling part which allows the first display part and the second display part to be hinge-coupled to each other.

In an embodiment, when the display device in a folded state, and the first display part is disposed to overlap the second display part on the second display part, the second display part may display an image of a single color.

In an embodiment, the first display part may display a text, and the single color is a complementary color of a color of the text.

In an embodiment, when the display device in a folded state, and the display device is positioned in a way such that the second display part is disposed on the first display part, the first display part may display a content image, and the second display part may display a user interface.

According to an embodiment of the disclosure, a method of manufacturing a display device includes: providing a dam on a carrier substrate; providing a first display part at one side of the dam and providing a second display part at the other side of the dam; and removing the carrier substrate, where one of the first display part and the second display part is transparent, and the other of the first display part and the second display part is opaque.

In an embodiment, the dam may include a plurality of pieces disposed in parallel to a boundary part between the first display part and the second display part, the plurality of pieces may be disposed in a mosaic shape in which the pieces are alternately provided to a left side and a right side.

In an embodiment, the dam may include a plurality of pieces alternately disposed in a first oblique direction and a second oblique direction intersecting the first oblique direction with respect to a boundary portion between the first display part and the second display part.

In an embodiment, the providing the first display part at the one side of the dam and providing the second display part at the other side of the dam may include: providing a base layer of each of the first display part and the second display part at the one side and the other side; providing a display panel of each of the first display part and the second display part at the one side and the other side; and providing a window layer of each of the first display part and the second display part at the one side and the other side.

In an embodiment, the method may further include, after the providing the display panel, providing an input sensing layer of the first display part at the one side.

In an embodiment, the method may further include providing an input sensing layer on a bottom surface of the base layer of the first display part.

In an embodiment, the method may further include, after the providing the display panel, providing a polarizing layer of the first display part at the one side.

In an embodiment, the method may further include providing a lower protective layer on a bottom surface of the base layer of the first display part.

In an embodiment, the removing the carrier substrate may include removing a portion of the carrier substrate corresponding to one of the first display part and the second display part.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
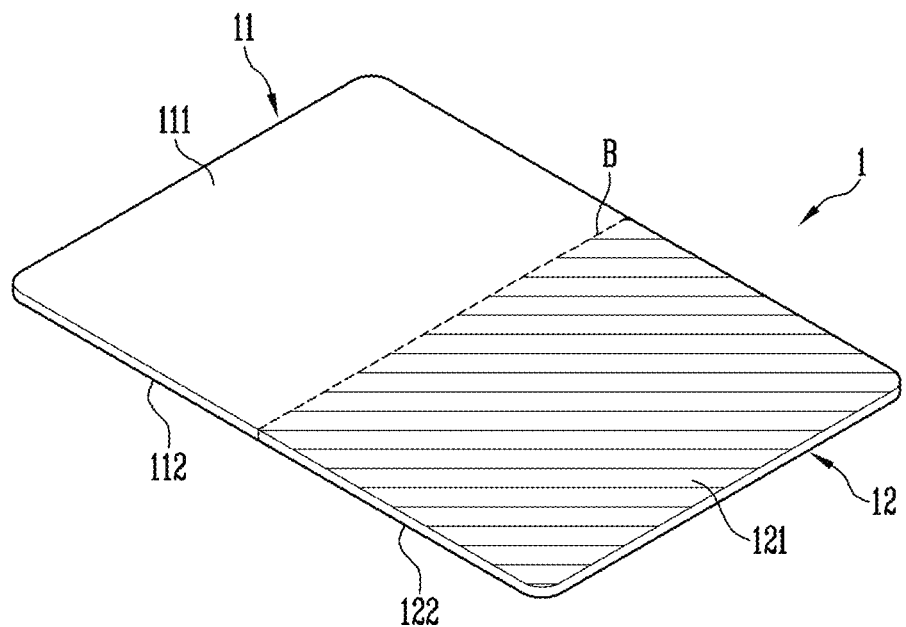
FIGS. 1 and 2 are views illustrating a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "connected" or "coupled" to another element, it can be directly connected or coupled to the another element or be indirectly connected or coupled to the another element with one or more intervening elements interposed therebetween. In contrast, when an element is referred to as being "directly connected" or "directly coupled" to another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

Figure 2:
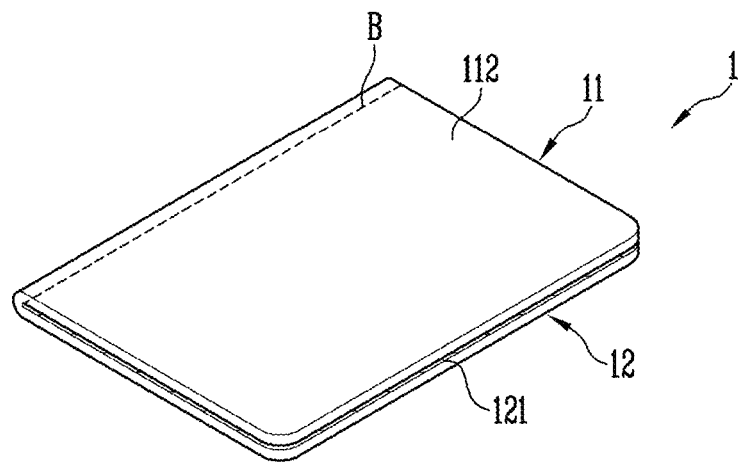

FIGS. 1 and 2 are views illustrating a display device according to an embodiment of the disclosure. Specifically, FIG. 1 illustrates an embodiment of the display device 1 in an unfolded state, and FIG. 2 illustrates an embodiment of the display device 1 in a folded state.

Referring to FIGS. 1 and 2, an embodiment of the display device 1 may include a first display part 11 and a second display part 12. In an embodiment, the first display part 11 may be transparent, and the second display part 12 may be opaque. In an embodiment, the first display part 11 may be defined by a portion of a transparent part of the display device 1, and the second display part 12 may be defined by a portion of an opaque part of the display device 1.

The first display part 11 may include a first surface 111 (e.g., a front surface) and a second surface 112 (e.g., a rear surface). The first display part 11 may be of a dual side emission type as being transparent. In such an embodiment, the first display part 11 may be configured in a way such that an image is viewed on both the first surface 111 and the second surface 112. In such an embodiment, a user may view, through the second surface 112, an image output through the first surface 111.

In an embodiment, when the user views an image through the second surface 112, the transparent part may reverse an image to be output through the first surface 111 and then display the reversed image (reversal driving). Accordingly, the user can view an image through the second surface 112 as if the image is substantially output through the first surface 111.

In such an embodiment where the first display part 11 is the transparent part, the first display part 11 may have a resolution lower than that of the second display part 12 which is the opaque part. Accordingly, the first display part 11 may be controlled to output an image including relatively easy and simple information. The information may include, for example, time, weather, a text message, a notice message, a user interface, etc.

The second display part 12 may include a first surface 121 (e.g., a front surface) and a second surface 122 (e.g., a rear surface). The second display part 12 is the opaque part, and may be configured in a way such that an image is displayed on the first surface 121.

In such an embodiment, where the second display part 12 is the opaque part, the second display part 12 may have a resolution higher than that of the first display part 11 which is the transparent part. Accordingly, the second display part 12 may be controlled to output an image having relatively high complexity. The image may include, for example, multimedia, a picture, navigation, etc.

The first display part 11 and the second display part 12 may be independently driven to display a same image as each other or different images from each other. Alternatively, the first display part 11 and the second display part 12 may be subordinately driven to display a same image as each other. In an embodiment, when the display device 1 is driven in a mirror mode, the first display part 11 and the second display part 12 may be controlled to display a same image as each other.

The display device 1 may be folded at a boundary part B between the first display part 11 and the second display part 12 as shown in FIG. 2. In FIG. 2, the boundary part B represents a boundary surface between the first display part 11 and the second display part 12, but the boundary part B is not limited thereto. In such an embodiment, the boundary part B may mean a portion of the display device 1 to which the first display part 11 and the second display part 12 are connected. In an embodiment, the boundary part B may be defined by adjacent portions of the first display part 11 and the second display part 12, in which a transparent part and an opaque part are mixed, and a boundary therebetween. In embodiments, the boundary part B may be referred to as an arbitrary portion, a boundary portion, a third display part, or the like.

In an embodiment, when the display device 1 is folded in a way such that the first surface 111 of the first display part 11 is in contact with the first surface 121 of the second display part 12, the user may view an image displayed on the first surface 121 of the second display part 12 through the first display part 11, which is transparent. The user may simultaneously view an image output through the second surface 112 of the first display part 11 together with an image of the first display part 11. Even when the first display part 11 is not driven or does not display any image, the user may view an image output from the second display part 12, which is output through the first display part 11.

The first display part 11 and the second display part 12 may be rigid or flexible. In an embodiment, both the first display part 11 and the second display part 12 may be either rigid or flexible. In an alternative embodiment, the first display part 11 may be rigid, and the second display part 12 may be flexible. Alternatively, the first display part 11 may be flexible, and the second display part 12 may be rigid.

In an embodiment, when one of the first display part 11 and the second display part 12 is rigid and the other of the first display part 11 and the second display part 12 is flexible, the display device 1 may be substantially folded at the flexible display part. In an embodiment, the first display part 11 and the second display part 12 have different areas or sizes from each other. In an embodiment, the flexible display part at which the display device 1 is folded may have an area wider than that of the rigid type display part. Hereinafter, embodiments where the display device 1 is folded at the boundary part B will be described in detail for convenience of description.

In an embodiment, when both the first display part 11 and the second display part 12 are rigid, the boundary part B may include a coupling part that couples the first display part 11 and the second display part 12 to each other, using a method such as hinge coupling.

The display device 1 may include a sensor to sense folding that occurs at the first display part 11, the second display part 12, and/or the boundary part B between the first display part 11 and the second display part 12. The sensor may be configured to sense, for example, a variation of an electrical value such as a resistance, a capacitance, and/or a magnetic field. The display device 1 may sense folding or unfolding information through the sensor, and control images displayed therein, corresponding to the sensed folding or unfolding information. The folding or unfolding information may include, for example, a folding angle, a folding direction, a folding position, etc.

In embodiments of the disclosure, the sensor may include at least one of various sensors for sensing three-axis rotation directions, velocity, acceleration, temperature, ambient brightness, geographical position, and the like of the display device 1. However, technical features of the disclosure are not limited thereto.

Hereinafter, for convenience of description, embodiments where the display device 1 displays an image in all regions on the first and second surfaces 111 and 112 of the first display part 11 and the first surface 121 of the second display part 12 will be described in detail. However, the disclosure is not limited thereto.

In embodiments of the disclosure, a non-display region in which any image is not displayed may be disposed at an edge portion of the first display part 11 and an edge portion of the second display part 12, which include the boundary part B of the display device 1. In such an embodiment, the non-display region may surround a display region. In an embodiment, signal pads connected to ends of signal lines for supplying a signal to the display region may be disposed in the non-display region. In such an embodiment, a driver for controlling emission of pixels (not shown) in the display region may be disposed in the non-display region.

In embodiments of the disclosure, the first display part 11 and the second display part 12 may have different stack structures from each other. Embodiments of the stack structures of the first display part 11 and second display part 12 will be described later in greater detail with reference to FIGS. 5 to 19.

Figure 3:
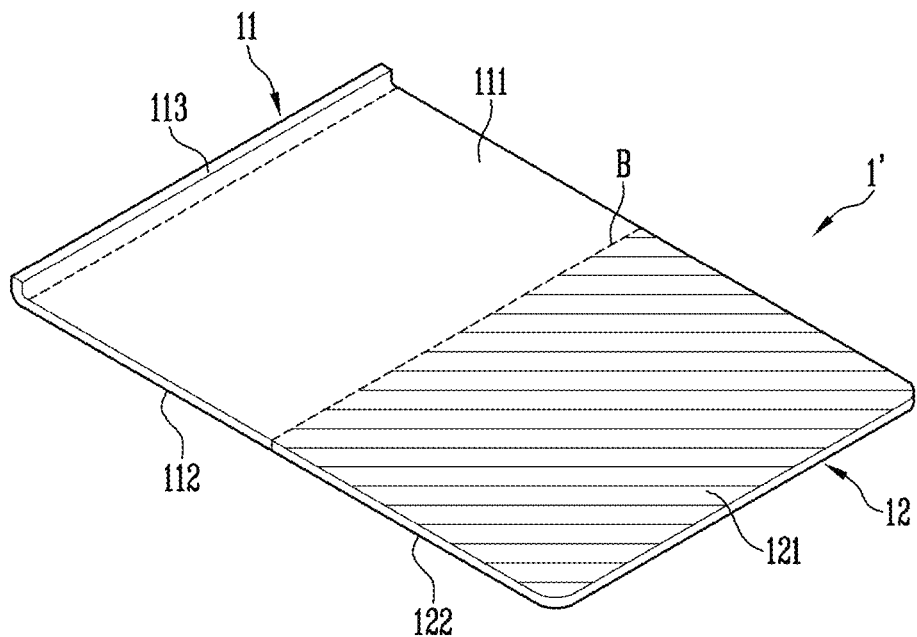
FIGS. 3 and 4 are views illustrating a display device according to another embodiment of the disclosure.
Figure 4:
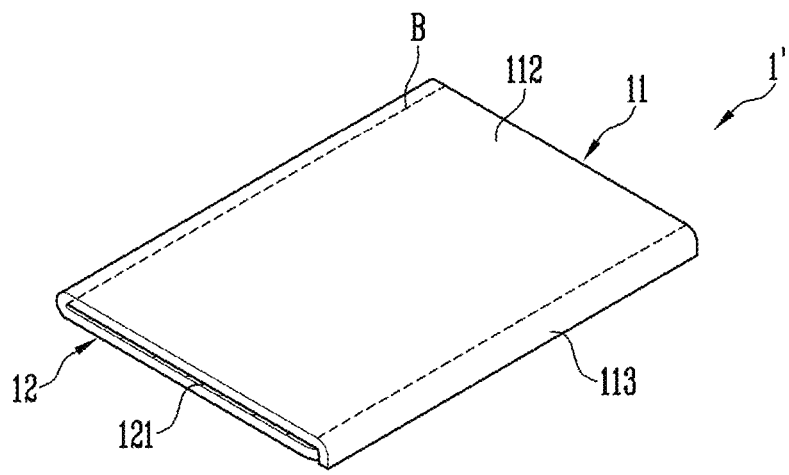

FIGS. 3 and 4 are views illustrating a display device according to an alternative embodiment of the disclosure. Specifically, FIG. 3 illustrates an embodiment of the display device 1' in an unfolded state, and FIG. 4 illustrates an embodiment of the display device 1' in a folded state.

Referring to FIGS. 3 and 4, in an embodiment of the display device 1', an edge region 113 of a first display part 11, which is opposite to an edge region thereof adjacent to a second display part 12, may be curved in a direction in which the edge region 113 become distant from a first surface 111 or a second surface 112 of the first display part 11.

In an embodiment, where the display device 1' is folded in a way such that the first surface 111 and the second surface 112 of the first display part 11 is in contact with a first surface 121 or a second surface 122 of the second display part 12, the curved edge region 113 may protrude outward of the second display part 12. In such an embodiment, the entire area of the first display part 11 including the edge region 113 may be larger than that of the second display part 12. As shown in FIG. 4, the curved edge region 113 covers an edge of the second display part 12, which is opposite to an edge thereof adjacent to the first display part 11, so that a folding state of the display device 1' may be more stably maintained.

Figure 5:
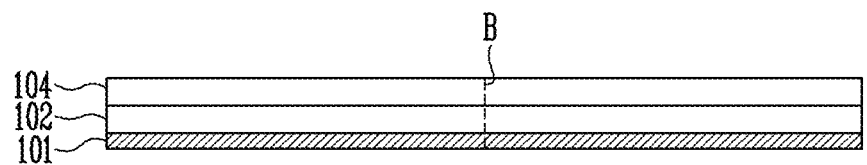
FIG. 5 is a sectional view of a display device according to an embodiment of the disclosure.
Figure 6:
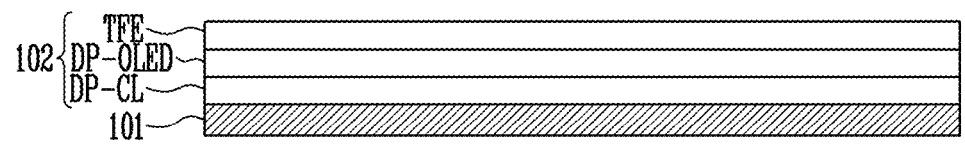
FIG. 6 is a sectional view illustrating an embodiment of a display panel shown in FIG. 5.

FIG. 5 is a sectional view of a display device according to an embodiment of the disclosure. FIG. 6 is a sectional view illustrating an embodiment of a display panel shown in FIG. 5.

Referring to FIGS. 5 and 6, an embodiment of the display device may include a base layer 101, a display panel 102, and a window layer 104.

The base layer 101 is a flexible substrate, and may include a film substrate and a plastic substrate, which include a polymer organic material. Generally, the flexibility of a material may be defined by a Young's modulus (i.e., a tensile strength) and the flexibility of a sheet may be defined by a Specific Flexure Rigidity($=Et^3/12$). E is a Young's Modulus and t is the thickness of a sheet. Herein, a material having flexibility means that the material may each independently have a Young's modulus (i.e., a tensile strength) of about 0.01 gigapascal (GPa) to about 300 GPa, e.g., about 0.05 GPa to about 220 GPa. Herein, a sheet, substrate or film having flexibility means that the sheet may each independently have a Specific Flexure Rigidity of about $1.04 \times 10^{-10}$ to about $1.2 \times 10^{-1}$ Nm, e.g., about $8.33 \times 10^{-10}$ to about $9.75 \times 10^{-3}$ Nm, or about $1.15 \times 10^{-9}$ to $2.6 \times 10^{-3}$ Nm. In one embodiment, for example, the base layer 101 may include at least one selected from polyethersulfone ("PES"), polyacrylate ("PA"), polyetherimide ("PEI"), polyethylene naphthalate ("PEN"), polyethylene terephthalate ("PET"), polyphenylene sulfide ("PPS"), polyarylate ("PAR"), polyimide ("PI"), polycarbonate ("PC"), triacetate cellulose ("TAC"), and cellulose acetate propionate ("CAP"). In an embodiment, the base layer 101 may include a fiber glass reinforced plastic ("FRP").

In an embodiment, the base layer 101 may be formed through a process of coating an adhesive material on a substrate (not shown) and removing the substrate after the adhesive material is cured. In one embodiment, for example, the base layer 101 may be formed by coating an adhesive material on a substrate through a process such as slit coating and then being separated from the substrate after the base layer 101 is cured. However, the forming method of the base layer 101 is not limited thereto.

In embodiments of the disclosure, the base layer 101 may include a transparent part at one side and an opaque part at the other side with respect to a boundary part B. Each of the transparent part and the opaque part may correspond to one of the first display part 11 and the second display part 12, which are shown in FIGS. 1 and 4.

In an embodiment, the transparent part of the base layer 101 may include or be made of a transmissive material. In such an embodiment, the opaque part of the base layer 101 may include or be made of an opaque, translucent or reflective material.

In an embodiment, a boundary surface between the transparent part and the opaque part may be formed in a shape of a curve, a wave, a quadrangular zigzag (referred to as a mosaic), a triangular zigzag, or the like. An image displayed at the boundary part B between the transparent part and the opaque part may be viewed by a user as if the image is gradated through the boundary part B. A forming method of the boundary part B will be described later in greater detail with reference to FIGS. 9 to 14.

The display panel 102 outputs an image. As shown in FIG. 6, the display panel 102 has a structure in which a circuit element layer DP-CL, a display element layer DP-OLED, and a thin film encapsulation layer TFE are sequentially disposed on the base layer 101.

The circuit element layer DP-CL includes an intermediate insulating layer and a circuit element. The intermediate insulating layer may include an intermediate inorganic layer and an intermediate organic layer. The inorganic layer may include at least one selected from a silicon nitride, silicon oxynitride, silicon oxide, and the like. The organic layer may include at least one selected from acryl-based resin, methacryl-based resin, polyisoprene, vinyl-based resin, epoxy-based resin, urethane-based resin, cellulose-based resin, siloxane-based resin, polyimide-based resin, polyamide-based resin, and perylene-based resin. The circuit element includes conductive patterns and/or semiconductor patterns. The circuit element may include signal lines, a driving circuit of a pixel (not shown), etc.

The circuit element layer DP-CL may be formed through a forming process of an insulating layer, using coating, deposition, etc., and a patterning process of a conductive layer and/or a semiconductor layer, using a photolithography process.

The display element layer DP-OLED may include an organic light emitting diode. The display element layer DP-OLED may further include an organic layer such as a pixel defining layer.

The thin film encapsulation layer TFE may cover the display element layer DP-OLED, to prevent moisture or foreign substance from penetrating into the display panel 102. The thin film encapsulation layer TFE may include an inorganic layer and an organic layer. The thin film encapsulation layer TFE may include at least two inorganic layers and an organic layer disposed therebetween. The inorganic layers may protect the display panel 102 from moisture/oxygen, and the organic layer may protect the display panel 102 from a foreign substance such as a dust particle. The inorganic layer may include at least one selected from a silicon nitride layer, a silicon oxynitride layer, a silicon oxide layer, a titanium oxide layer, an aluminum oxide layer, etc. The organic layer may include an acryl-based organic layer, but the disclosure is not limited thereto.

In an embodiment, a capping layer covering the display element layer DP-OLED may be further disposed between the thin film encapsulation layer TFE and the display element layer DP-OLED. The thin film encapsulation layer TFE may directly cover the capping layer.

In embodiments of the disclosure, the display panel 102 may be formed to have a transparent part at one side and an opaque part at the other side with respect to the boundary part B.

in such embodiments, at the one side of the boundary part B, an electrode of the organic light emitting diode disposed in the display element layer DP-OLED of the display panel 102 may be a transmissive electrode. The transmissive electrode may include a transparent metal oxide, e.g., indium tin oxide ("ITO"), indium zinc oxide ("IZO"), zinc oxide (ZnO) or indium tin zinc oxide ("ITZO").

In such embodiments, at the other side of the boundary part B, an electrode of the organic light emitting diode disposed in the display element layer DP-OLED of the display panel 102 may be a semi-transmissive or reflective electrode. The semi-transmissive or reflective electrode of one of two opposing electrodes (e.g., a pixel electrode and a common electrode) may include Ag, Mg, Al, Pt, Pd, Au, Ni, Nd, Ir, Cr, or a combination (e.g., compound or mixture) thereof. In such embodiments, the semi-transmissive or reflective electrode of the other of the two opposing electrodes may include Li, Ca, LiF/Ca, LiF/Al, Al, Mg, BaF, Ba, Ag, or a combination thereof (e.g., a mixture of Ag and Mg).

The window layer 104 may protect the display panel 102 from external impact, and provide an input surface to the user. The window layer 104 may be attached to an upper surface of the display panel 102 through an adhesive member. Alternatively, the window layer 104 may be formed on the upper surface of the display panel 102, using a method such as coating or printing. In one embodiment, for example, the window layer 104 may be formed on the upper surface of the display panel 102 through roll coating, silkscreen coating, spray coating, slit coating, etc. However, the method of forming the window layer 104 is not limited thereto.

The window layer 104 may include or be formed of a transparent material that allows light to be transmitted therethrough. In one embodiment, for example, the window layer 104 may include or be formed of a plastic or glass material having impact resistance.

In an embodiment, the boundary part B may be defined or formed at a central portion of the display device as illustrated in FIG. 5, the disclosure is not limited thereto. In an alternative embodiment, the boundary part B may be formed at a left side or right side instead of the central portion of the display device. Accordingly, the first display part 11 and the second display part 12 may have different areas or sizes from each other. In an embodiment, only one of the first display part 11 and the second display part 12 may be implemented to be flexible, and the boundary part B may be formed in a way such that the display part, which is flexible, has an area wider than that of the other display part. However, the disclosure is not limited thereto.

Figure 7:
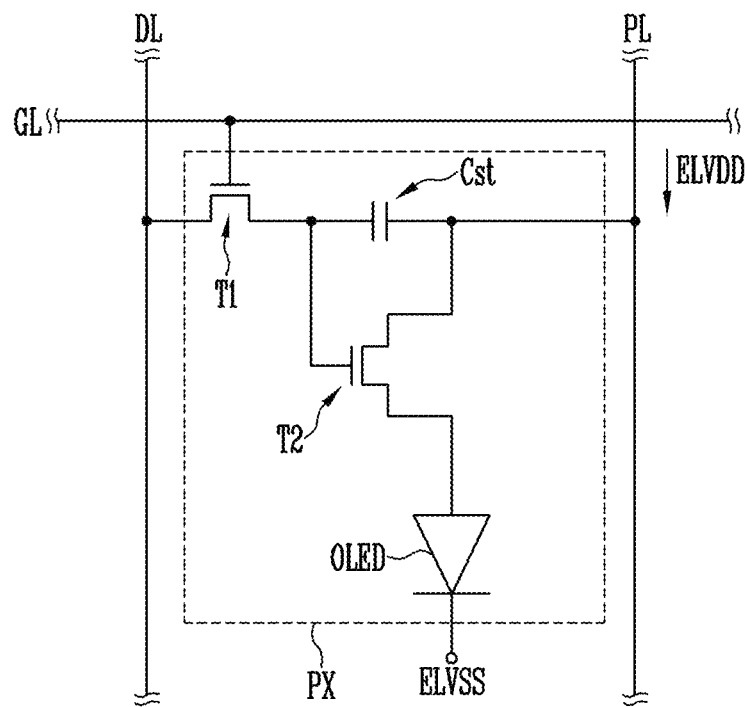
FIG. 7 is an equivalent circuit diagram of a pixel according to an embodiment of the disclosure.
Figure 8:
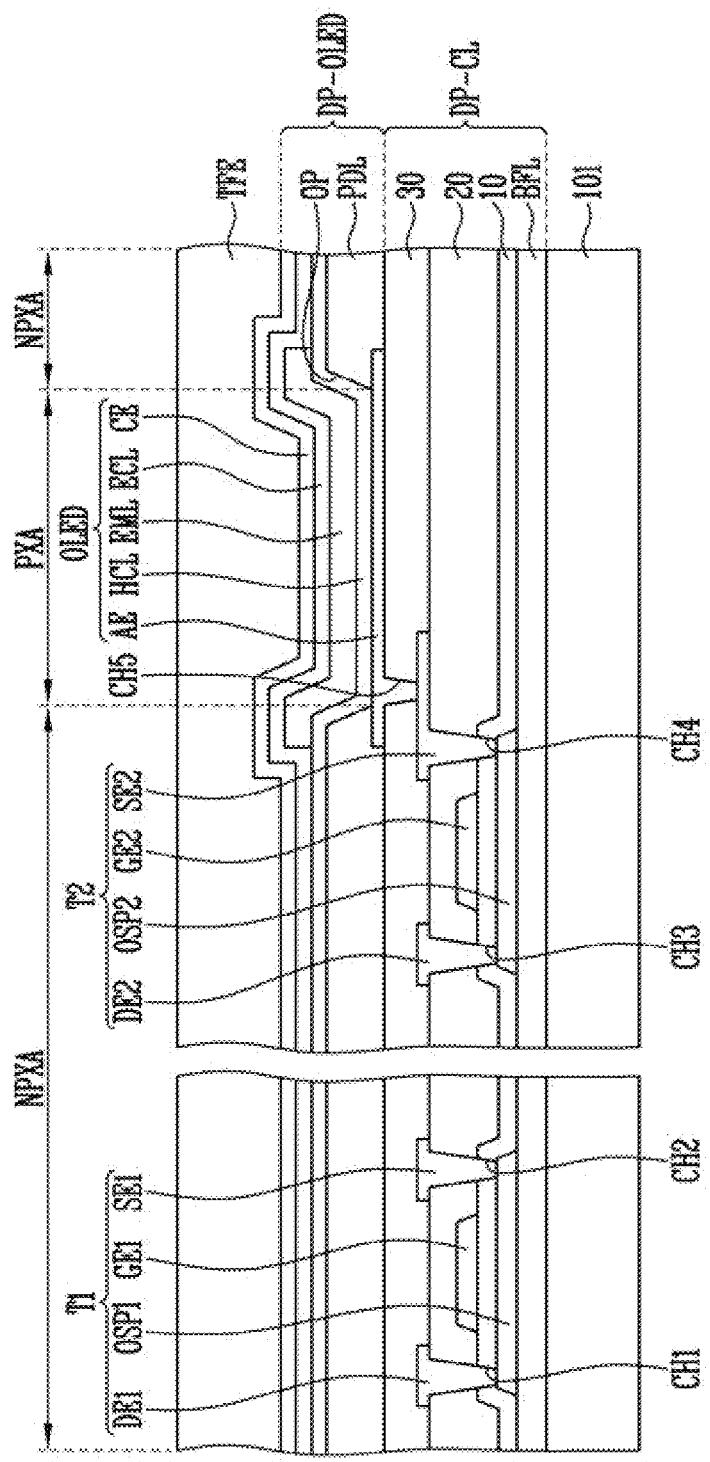
FIG. 8 is an enlarged sectional view of a display panel according to an embodiment of the disclosure.

FIG. 7 is an equivalent circuit diagram of a pixel PX according to an embodiment of the disclosure. FIG. 8 is an enlarged sectional view of a display panel according to an embodiment of the disclosure. Specifically, the pixel PX of FIG. 7 is an equivalent circuit diagram of a pixel to be provided in the first display part 11 and the second display part 12, which are shown in FIGS. 1 to 4, and FIG. 8 is an enlarged sectional view of the display panel 102 shown in FIG. 6.

A pixel PX connected to one scan line GL, one data line DL, and a power line PL is exemplarily illustrated in FIG. 7. The configuration of the pixel PX is not limited thereto, and may be variously modified.

An organic light emitting diode OLED may be a top-emission type diode or a bottom-emission type diode. The pixel PX may include a first transistor T1 (or switching transistor), a second transistor T2 (or driving transistor), and a capacitor Cst, which constitute a pixel driving circuit for driving the organic light emitting diode OLED. A first power voltage ELVDD is provided to the second transistor T2, and a second power voltage ELVSS is provided to the organic light emitting diode OLED. The second power voltage ELVSS may be a voltage lower than the first power voltage ELVDD.

The first transistor T1 outputs a data signal applied to the data line DL in response to a scan signal applied to the scan line GL. The capacitor Cst charges a voltage corresponding to the data signal received from the first transistor T1.

The second transistor T2 controls a driving current flowing through the organic light emitting diode OLED, corresponding to a charge amount stored in the capacitor Cst.

FIG. 8 illustrates a partial section of the display panel 102 corresponding to the equivalent circuit shown in FIG. 7. A circuit element layer DP-CL, a display element layer DP- OLED, and a thin film encapsulation layer TFE are sequentially disposed on a base layer 101.

The circuit element layer DP-CL includes at least one inorganic layer, at least one organic layer, and a circuit element. The circuit element layer DP-CL may include a buffer layer BFL, a first intermediate inorganic layer 10, and a second intermediate inorganic layer 20, which are inorganic layers, and an intermediate organic layer 30 which is an organic layer.

The inorganic layers may include at least one selected from silicon nitride, silicon oxynitride, silicon oxide, and the like. The organic layer may include at least one selected from acryl-based resin, methacryl-based resin, polyisoprene, vinyl-based resin, epoxy-based resin, urethane-based resin, cellulose-based resin, siloxane-based resin, polyimide-based resin, polyamide-based resin, and perylene-based resin. The circuit element includes conductive patterns and/or semiconductor patterns.

The buffer layer BFL improves coherence between the base layer 101 and the conductive patterns or semiconductor patterns. Although not shown in the drawing, a barrier layer that prevents introduction of a foreign substance may be further disposed on an upper surface of the base layer 101. The buffer layer BFL and the barrier layer may be selectively omitted.

A semiconductor pattern OSP1 (hereinafter, referred to as a first semiconductor pattern) of a first transistor T1 and a semiconductor pattern OSP2 (hereinafter, referred to as a second semiconductor pattern) of a second transistor T2 may be disposed on the buffer layer BFL. The first semiconductor pattern OSP1 and the second semiconductor pattern OSP2 may include at least one selected from amorphous silicon, poly-silicon, and metal oxide semiconductor.

The first intermediate inorganic layer 10 is disposed over the first semiconductor pattern OSP1 and the second semiconductor pattern OSP2. A control electrode GE1 (hereinafter, referred to as a first control electrode) of the first transistor T1 and a control electrode GE2 (hereinafter, referred to as a second control electrode) of the second transistor T2 are disposed on the first intermediate inorganic layer 10. The first control electrode GE1 and the second control electrode GE2 may be manufactured according to the same photolithography process as the scan line GL.

The second intermediate inorganic layer 20 covering the first control electrode GE1 and the second control electrode GE2 is disposed on the first intermediate inorganic layer 10. An input electrode DE1 (hereinafter, referred to as a first input electrode) and an output electrode SE1 (hereinafter, referred to as a first output electrode of the first transistor T1 and an input electrode DE2 (hereinafter, referred to as a second input electrode) and an output electrode SE2 (hereinafter, referred to as a second output electrode) of the second transistor T2 are disposed on the second intermediate inorganic layer 20.

The first input electrode DE1 and the first output electrode SE1 are connected to the first semiconductor pattern OSP1 respectively through a first through hole CH1 and a second through hole CH2, which are defined through the first intermediate inorganic layer 10 and the second intermediate inorganic layer 20. The second input electrode DE2 and the second output electrode SE2 are connected to the second semiconductor pattern OSP2 respectively through a third through hole CH3 and a fourth through hole CH4, which are defined through the first intermediate inorganic layer 10 and the second intermediate inorganic layer 20. In an alternative embodiment of the disclosure, a portion of the first transistor T1 and the second transistor may be modified to have a bottom gate structure.

The intermediate organic layer 30 covering the first input electrode DE1, the second input electrode DE2, the first output electrode SE1, and the second output electrode SE2 is disposed on the second intermediate inorganic layer 20. The intermediate organic layer may provide a flat surface.

The display element layer DP-OLED is disposed on the intermediate organic layer 30. The display element layer DP-OLED may include a pixel defining layer PDL and an organic light emitting diode OLED. In an embodiment, the pixel defining layer PDL may include an organic material. A first electrode AE is disposed on the intermediate organic layer 30. The first electrode AE is connected to the second output electrode SE2 through a fifth through hole CH5 defined through the intermediate organic layer 30. An opening OP is defined in the pixel defining layer PDL. The opening OP of the pixel defining layer PDL exposes at least a portion of the first electrode AE.

The pixel PX may be disposed in a pixel region when viewed from a plan view in a thickness direction of the base layer 101. The pixel region may include an emission region PXA and a non-emission region NPXA adjacent to the emission region PXA. The non-emission region NPXA may surround the emission region PXA. In an embodiment, as shown in FIG. 8, the emission region PXA is defined to correspond to a partial region of the first electrode AE exposed through the opening OP.

The hole control layer HCL may be disposed in common to the emission region PXA and the non-emission region NPXA, that is, disposed to entirely cover the emission region PXA and the non-emission region NPXA.

An emitting layer EML is disposed on a hole control layer HCL. The emitting layer EML may be disposed in a region corresponding to the opening OP. The emitting layer EML may include an organic material and/or an inorganic material. In an embodiment, a emitting layer EML may be a patterned layer as shown in FIG. 8, but not being limited thereto. Alternatively, the emitting layer EML may be commonly disposed in a plurality of pixels PX. The emitting layer EML may generate white light. In an embodiment, the emitting layer EML may have a multi-layered structure.

An electron control layer ECL is disposed on the emitting layer EML.

A second electrode CE is disposed on the electron control layer ECL. The second electrode CE is commonly disposed in the plurality of pixels PX.

The thin film encapsulation layer TFE is disposed over the second electrode CE. In an embodiment, as shown in FIG. 8, the thin film encapsulation layer TFE may directly cover the second electrode CE. In an embodiment of the disclosure, a capping layer covering the second electrode CE may be further disposed between the thin film encapsulation layer TFE and the second electrode CE. The thin film encapsulation layer TFE may directly cover the capping layer.

FIGS. 9 to 14 are views illustrating a manufacturing method of a gradation boundary part of a display device according to an embodiment of the disclosure.

Figure 9:
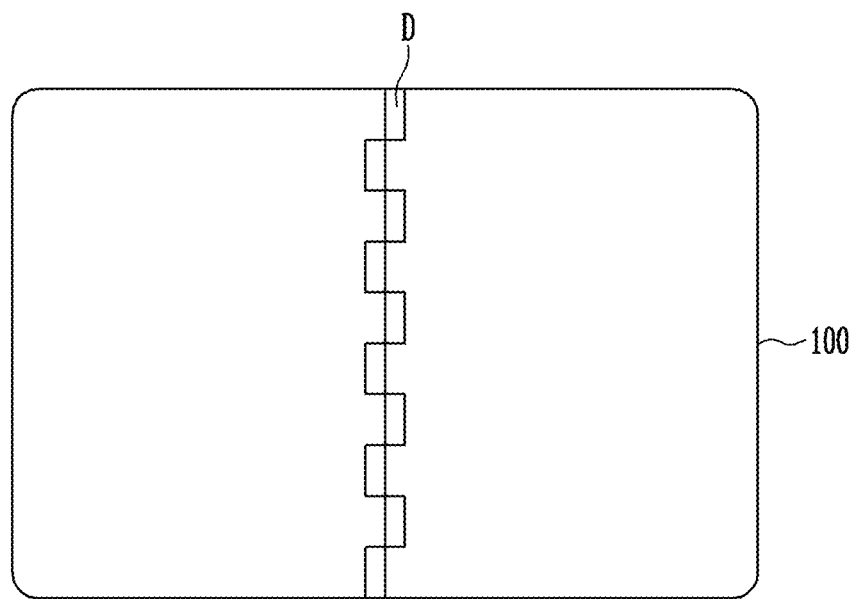
FIGS. 9 to 14 are views illustrating a manufacturing method of a gradation boundary part of a display device according to an embodiment of the disclosure.
Figure 10:
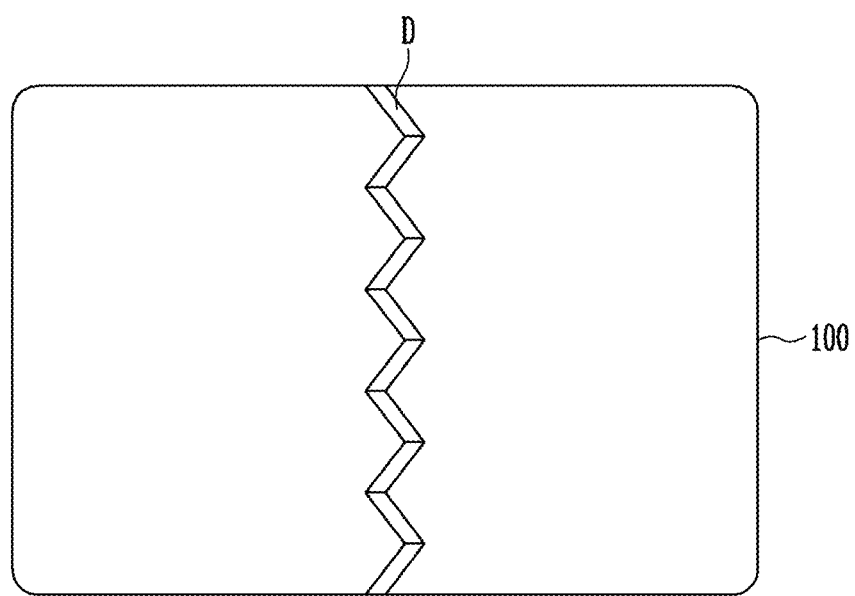

Referring to FIGS. 9 and 10, first, a dam D is provided or formed on a carrier substrate 100.

The carrier substrate 100 is a rigid substrate, and may support a base layer 101 to be formed thereon in a subsequent process.

The dam D may be disposed in at least one region on the carrier substrate 100 in a shape corresponding to a boundary surface between a transparent part and an opaque part of the display device.

The dam D may include a transparent resin or opaque resin.

In an embodiment, as shown in FIGS. 9 to 14, the dam D may include a plurality of quadrangular pieces disposed to form a boundary surface having a mosaic or zigzag shape.

Referring to FIG. 9, in an embodiment, the dam D includes a plurality of pieces. The plurality of pieces may be aligned in parallel to the boundary surface, and be disposed in a mosaic shape in which the pieces are alternately provided to a left side and a right side. In an alternative embodiment, referring to FIG. 10, the plurality of pieces may be alternately aligned in a first oblique direction and a second oblique direction intersecting the first oblique direction with respect to the boundary surface. Therefore, in such an embodiment, the plurality of pieces may be disposed in a zigzag shape.

In other alternative embodiments, the boundary surface is formed as a curve, a wavy line, etc., and the dam D may be formed in various shapes corresponding to the boundary surface. In an embodiment, the dam D may have a sufficiently thin thickness such that separation between the transparent part and the opaque part is not viewed by a user after a display panel is formed.

Figure 11:
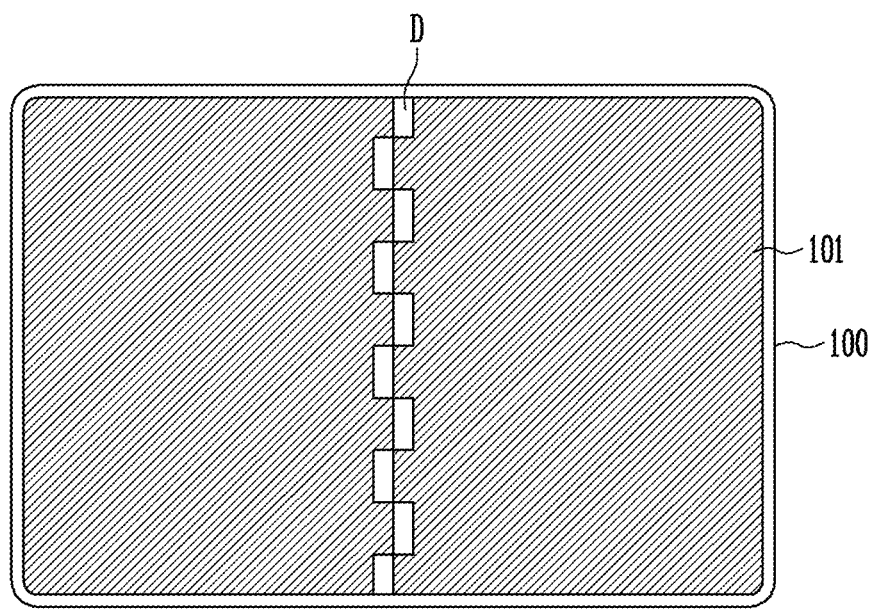
Figure 12:
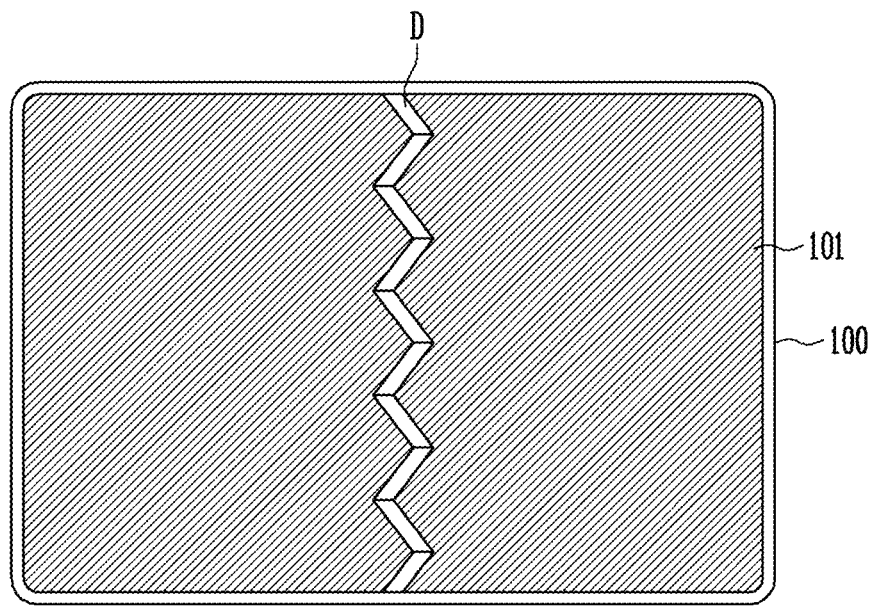

Referring to FIGS. 11 and 12, after the dam D is formed, a material for forming the transparent part is coated on the carrier substrate 100 at one side of the dam D, and a material for forming the opaque part is coated on the carrier substrate 100 at the other side of the dam D. In one embodiment, for example, a transparent resin may be coated on the transparent part, and an opaque resin may be coated on the opaque part. Therefore, the base layer 101 may include the transparent part including the transparent resin and the opaque part including the opaque resin.

The transparent resin may include at least one selected from PES, PA, PEI, PEN, PET, PPS, PAR, PI, PC, TAC, and CAP The opaque resin may include a transparent resin and a dye or pigment dispersed in the transparent resin. In one embodiment, for example, the opaque resin may include a transparent resin and a black pigment such as carbon black.

The dam D may include a same material as the transparent resin of the transparent part or the opaque resin of the opaque part.

A boundary line between the transparent resin and the opaque resin has a shape of a mosaic, a zigzag, a curve, or a wavy line.

Figure 13:
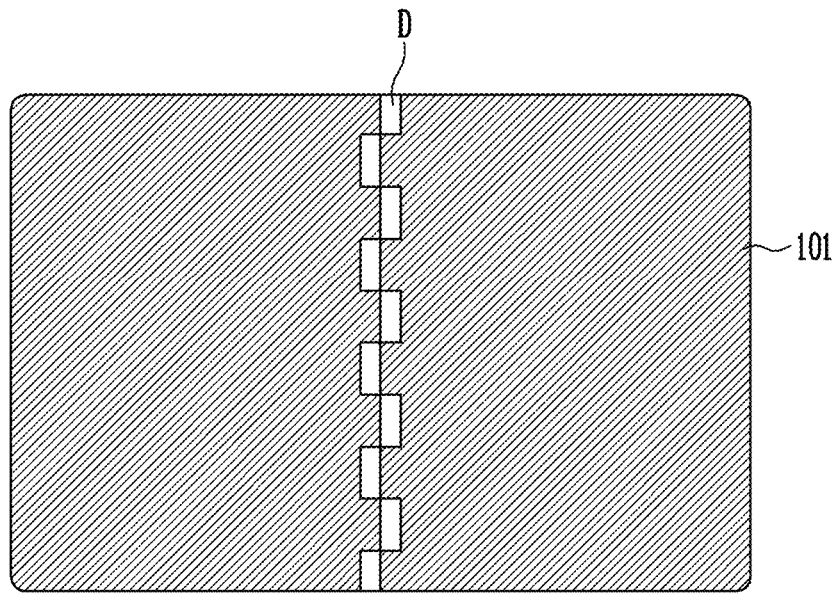
Figure 14:
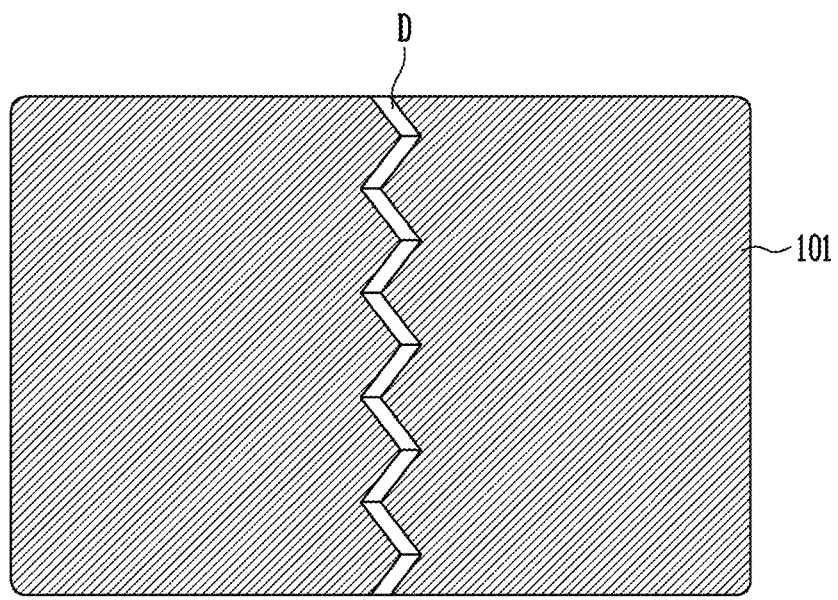

Referring to FIGS. 13 and 14, after materials for the transparent part and the opaque part are respectively coated at both sides of the dam D, the carrier substrate 100 may be removed.

In an embodiment, a gradation boundary part B of the base layer 101 is formed on the carrier substrate, but the disclosure is not limited thereto. In an alternative embodiment, when different materials or different processes for the transparent part and the opaque part are applied, processes shown in FIGS. 9 to 14 may be performed on the display panel 102, the window layer 104, and the like, which constitute the display device. In an embodiment, when at least one layer for the transparent part and the opaque part is formed of a same material through a same process as those described above, the dam D may be removed before the corresponding layer is formed, and then the corresponding layer may be formed.

In one embodiment, for example, after the dam D is formed on the carrier substrate 100, the base layer 101 may be formed as described above. Subsequently, the display panel 102 in which the electrode of the organic light emitting diode is a transmissive electrode may be provided or formed at one side of the dam D, and the display panel 102 in which the electrode of the organic light emitting diode is a semi-transmissive or reflective electrode may be provided or formed at the other side of the dam D. After the base layer 101 and the display panel 102 are provided or formed, the carrier substrate 100 and the dam D may be removed from the base layer 101 and the display panel 102. Subsequently, the window layer 104 for the transparent part and the opaque part may be provided or formed on the display panel 102 through a single process, thereby manufacturing the display device.

However, the manufacturing process of the display device is not limited to the above-described method. A portion of the manufacturing process may be omitted, or more processes may be additionally performed, according to the structures or components of the transparent part and the opaque part.

Figure 15:
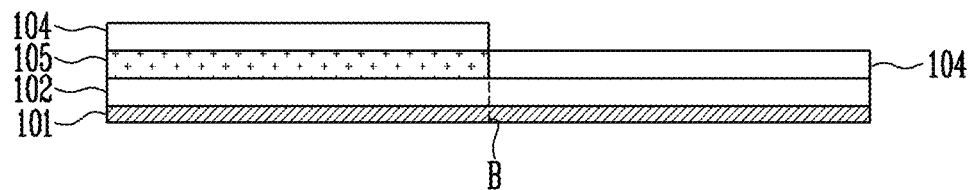
FIG. 15 is a sectional view of a display device according to an alternative embodiment of the disclosure.
Figure 16:
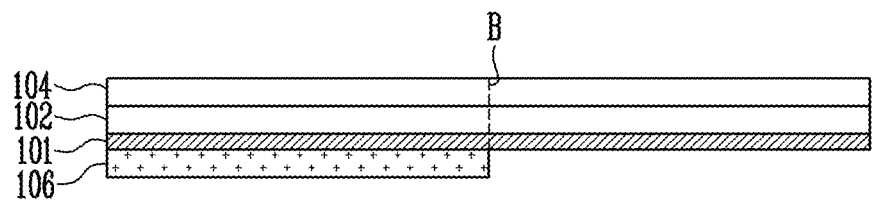
FIG. 16 is a sectional view of a display device according to another alternative embodiment of the disclosure.

FIG. 15 is a sectional view of a display device according to an alternative embodiment of the disclosure. FIG. 16 is a sectional view of a display device according to another alternative embodiment of the disclosure.

Embodiments of the display device shown in FIGS. 15 and 16 are substantially the same as the embodiment shown in FIG. 5 except for an input sensing layer 105 or 106. The input sensing layer 105 or 106 may be configured to acquire coordinate information of an external input that occurs on the display device. The external input may be a direct touch or an indirect touch.

In embodiments of the disclosure, the input sensing layer 105 or 106 is provided at only one side of the boundary part B, and may not be provided at the other side of the boundary part B. In an embodiment, the one side of the boundary part B, at which the input sensing layer 105 or 106 is provided, may form the transparent part, and the other side of the boundary part B, at which the input sensing layer 105 or 106 is not provided, may form the opaque part. However, the disclosure is not limited thereto.

The input sensing layer 105 or 106 may sense an input, for example, an input by a pentile or force touch method. In an embodiment, where the input sensing layer 105 or 106 senses an input, by the pentile method, the input sensing layer 105 may be disposed between the display panel 102 and the window layer 104 as shown in FIG. 15. In an embodiment, where the input sensing layer 105 or 106 senses an input, using the force touch method, the input sensing layer 106 may be disposed on a bottom surface of the base layer 101 as shown in FIG. 16.

Figure 17:
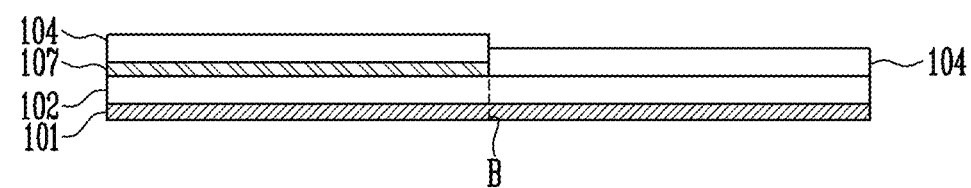
FIG. 17 is a sectional view of a display device according to another alternative embodiment of the disclosure.

FIG. 17 is a sectional view of a display device according to another alternative embodiment of the disclosure.

The display device shown in FIG. 17 is substantially the same as the embodiment shown in FIG. 5 except that a polarizing layer 107 is provided between the display panel 102 and the window layer 104. The polarizing layer 107 may decrease reflectivity of light incident from the outside by absorbing, destructively interfering, or polarizing the light. In one embodiment, for example, the polarizing layer 107 may include a polarizing film and a retardation film, to polarize or destructively interfere incident light, thereby decreasing a reflectivity of the incident light. Alternatively, for example, the polarizing layer 107 may include a plurality of color filter layers, a member (e.g., a black matrix) for absorbing light, and the like, to absorb incident light, thereby decreasing a reflectivity of the incident light.

In embodiments of the disclosure, the polarizing layer 107 may be used to provide a privacy function of the display device. In such an embodiment, the viewing angle of the display device is decreased by the polarizing layer 107 or the visibility of the display device is lowered by the polarizing layer 107, so that an image displayed in the display device may be prevented from being exposed to viewers other than a user.

In embodiments of the disclosure, the polarizing layer 107 is provided at only one side of the boundary part B, and may not be provided at the other side of the boundary part B. In an embodiment, the one side of the boundary part B, at which the polarizing layer 107 is provided, may define the transparent part, and the other side of the boundary part B, at which the polarizing layer 107 is not provided, may define the opaque part. However, the disclosure is not limited thereto.

In an embodiment in which the polarizing layer 107 is provided in the transparent part, when the display device is folded at the boundary part B such that the transparent part is disposed on the opaque part, the privacy function of the display device may be provided, which will be described later in detail with reference to FIG. 20.

In an embodiment, the polarizing layer 107 may be thinner than the window layer 104 as illustrated in FIG. 17, but the disclosure is not limited thereto.

Figure 18:
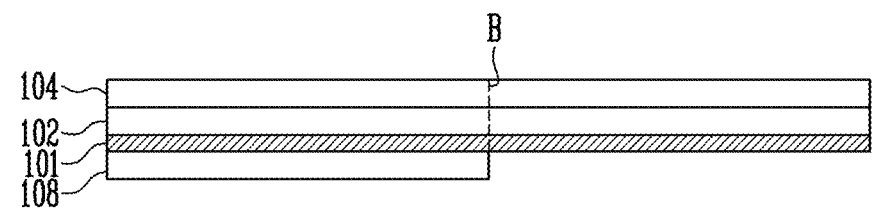
FIG. 18 is a sectional view of a display device according to another alternative embodiment of the disclosure.

FIG. 18 is a sectional view of a display device according to another alternative embodiment of the disclosure.

The embodiment of the display device shown in FIG. 18 is substantially the same as the embodiment shown in FIG. 5 except that a lower protective layer 108 is provided on the bottom surface of the base layer 101. The lower protective layer 108 may effectively prevent external moisture, etc. from penetrating into the display device, and absorb external impact.

The lower protective layer 108 may be provided in the form of a protective film, and include a plastic film as a base layer. The protective film may include a plastic film including at least one selected from PES, PAR, PEI, PEN, PET, PPS, PI, PC, poly(aryleneether sulfone), and a combination thereof.

The material constituting the protective film is not limited to plastic resins, and may include organic/inorganic composite material. The protective film may include a porous organic layer and an inorganic material filled in pores of the organic layer. The protective film may further include a functional layer formed in the plastic film. The functional layer may include a resin layer. The functional layer may be formed through a coating.

Figure 19:
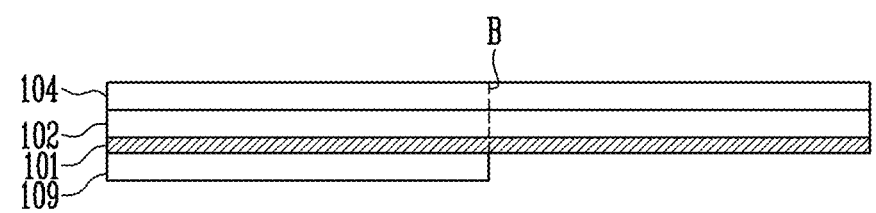
FIG. 19 is a sectional view of a display device according to another alternative embodiment of the disclosure.

FIG. 19 is a sectional view of a display device according to another alternative embodiment of the disclosure.

The embodiment of the display device shown in FIG. 19 is substantially the same as the embodiment shown in FIG. 5, except that a supporting plate 109 is provided on the bottom surface of the base layer 101. The supporting plate 109 may include or be made of a rigid glass, a plastic, a metallic material, or the like, but the material constituting the supporting plate 109 is not particularly limited as long as being rigid.

In such an embodiment, the supporting plate 109 may be of a hard type. In such an embodiment, a display part may be implemented to be of the hard type in a region in which the supporting plate 109 is formed.

In embodiments of the disclosure, the supporting plate 109 may be formed at one side or both sides of the boundary part B. In an embodiment, the supporting plate 109 may be provided at only the one side of the boundary part B to implement the transparent part to be of the hard type. In an alternative embodiment, the supporting plate 109 may be provided at only the other side of the boundary part B to implement the transparent part to be of the hard type. In another alternative embodiment, the supporting plate 109 may be provided at both the sides of the boundary part B to implement both the transparent part and the opaque part to be of the hard type.

In an embodiment, the supporting plate 109 may be disposed or formed on the bottom surface of the base layer 101 by not removing at least a portion of the carrier substrate 100 from the base layer 101 when the process shown in FIG. 13 or 14 is performed. In such an embodiment, the supporting plate 109 may be the carrier substrate 100 shown in FIGS. 9 to 14.

In an alternative embodiment, the supporting plate 109 may be provided or formed on the bottom surface of the base layer by being attached to the bottom of the base layer 101 after the process shown in FIG. 13 or 14 is performed.

Herein, various embodiments of the display device are described with reference to FIGS. 15 to 19. However, in embodiments of the disclosure, the display device may be implemented by combining such embodiments. In one embodiment, for example, the input sensing layer 105 or 106, the polarizing layer 107, and the lower protective layer 108 may all be provided at one side of the boundary part B of the display device.

In embodiments of the disclosure, at least one of the input sensing layer 105 or 106, the polarizing layer 107, the lower protective layer 108, and the supporting plate 109 may be provided in only a display part (e.g., the transparent part) formed at one side of the boundary part B of the display device. In such embodiments, a functional layer for increasing the thickness of the display device may be disposed in only one of the first display part 11 and the second display part 12, and functions to be implemented by the functional layer may be provided by the corresponding display part.

In such an embodiment, a folding curvature is allowed to be decreased as compared with a case where functional layers are stacked in both the first display part 11 and the second display part 12. When the folding curvature or a radius of curvature at a folded portion is decreased, the base layer 101, the display panel 102, or the window layer 104 may be effectively prevented from being damaged at the boundary part B in spite of repetitive folding operations of the display device 1. A user may be provided with functions to be implemented by the functional layers from one of the first display part 11 and the second display part 12, and thus there is no inconvenience in use of the display device 1.

FIGS. 20 to 23 are views illustrating various control methods of a display device according to an embodiment of the disclosure.

Figure 20:
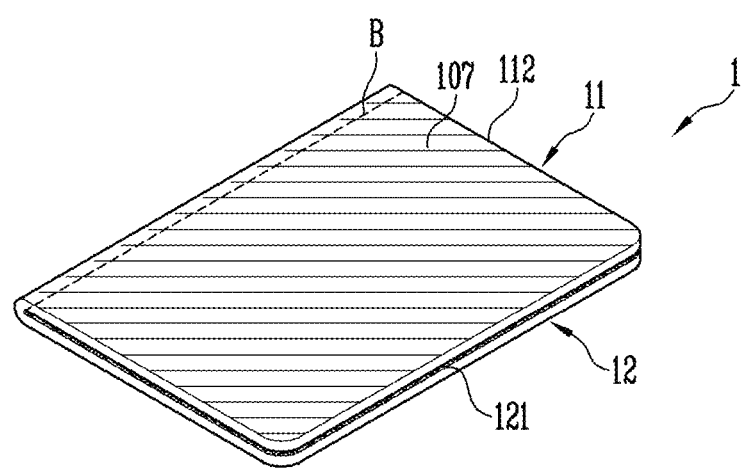
FIGS. 20 to 23 are views illustrating various control methods of a display device according to an embodiment of the disclosure.

Referring to FIG. 20, in an embodiment of the disclosure, a polarizing layer 107 may be provided or formed in the first display part 11. The viewing angle of the first display part 11 may be decreased by the polarizing layer 107, or the visibility of the first display part 11 may be lowered by the polarizing layer 107. Therefore, the first display part 11 in which the polarizing layer 107 is provided may provide a privacy function with respect to a user, i.e., a function of preventing an image displayed on the first display part 11 from being easily viewed.

In an embodiment, the user may allow the first display part 11 to be disposed on the second display part 12 by folding the boundary part B between the first display part 11 and the second display part 12 to improve the privacy function.

In an embodiment, when the first display part 11 is a transparent part and the second display part 12 is an opaque part, the user may fold the boundary part B in a direction in which the first surface 111 or the second surface 112 of the first display part 11 is exposed to the outside. When the boundary part B is folded in the direction in which the first surface 111 is exposed to the outside, an image displayed on the first surface 121 of the opaque second display part 12 is not viewed by the user. When the boundary part B is folded in the direction in which the second surface 112 is exposed to the outside, an image displayed on the first surface 121 of the second display part 12 through the transparent first display part 11 may be viewed by the user.

In an embodiment, an image of a single color may be displayed on the first display part 11 to increase the visibility of an image displayed on the first display part 11, which will be described later in greater detail with reference to FIG. 21.

In an embodiment of the disclosure, when it is sensed that the display device 1 is in the folded state, that is, it is sensed that the first display part 11 is exposed to the top of the second display part 12, the display device 1 may control the first display part 11 and the second display part 12 in a way such that the privacy function may be more efficiently provided. In an embodiment, the display device 1 may control the brightness of the first display part 11 to be dark, or control the color temperature of the first display part 11 to be a yellow tone. Alternatively, the display device display the resolution of an image displayed on the first display part 11 to be lowered, or display the size of the image to be reduced.

Figure 21:
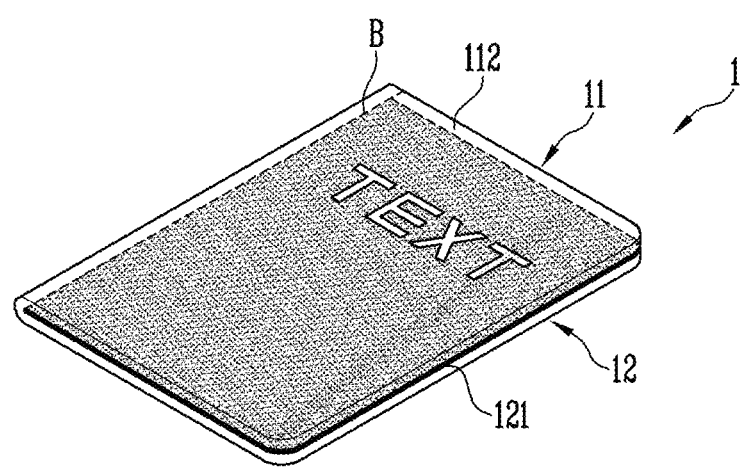

Referring to FIG. 21, in embodiments of the disclosure, when the first display part 11 is the transparent part and the second display part 12 is the opaque part, the user may fold the boundary part B in a direction in which the second surface 112 of the first display part 11 is exposed to the outside. In an embodiment, an image displayed on the first surface 121 of the second display part 12 through the transparent first display part 11 may be viewed by the user as if the image is a background.

In an embodiment, a content including a text, such as a text message, an electronic book, or a document, may be displayed on the second surface 112 of the first display part 11. In an embodiment, an image of a single color may be displayed on the first surface 121 of the second display part 12 to increase the readability of a text. The single color may be, for example, black, white, green, or the like. However, the disclosure is not limited thereto, and the color of an image displayed on the second display part 12 may be determined as a complementary color of the color of a text displayed on the first display part 11.

The image of the single color, which is displayed on the second display part 12, may be viewed by the user as if the image is a background of the text displayed on the first display part 11. When a color contrast with the color of the text is displayed at the background, the readability of the text may be improved.

When a folding is sensed at the boundary part B, it is sensed that the first display part 11 is exposed to the top of the second display part 12, and it is sensed that a text is displayed in an image displayed on the second surface 112 of the first display part 11, the display device 1 may control the second display part 12 such that an image of a single color is displayed on the second display part 12. The display device 1 may sense a color of the text displayed on the second surface 112 of the first display part 11, and control the second display part 12 such that an image of a complementary color of the sensed color of the text is displayed on the second display part 12.

Figure 22:
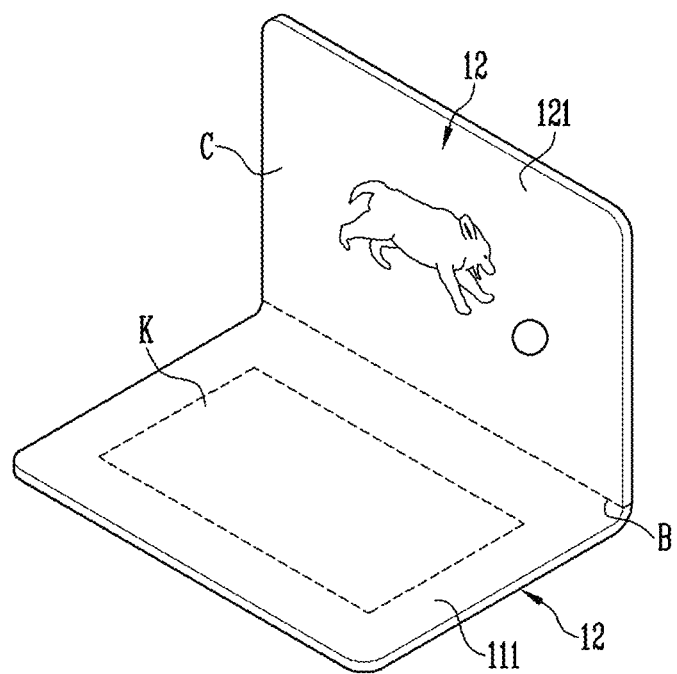
Figure 23:
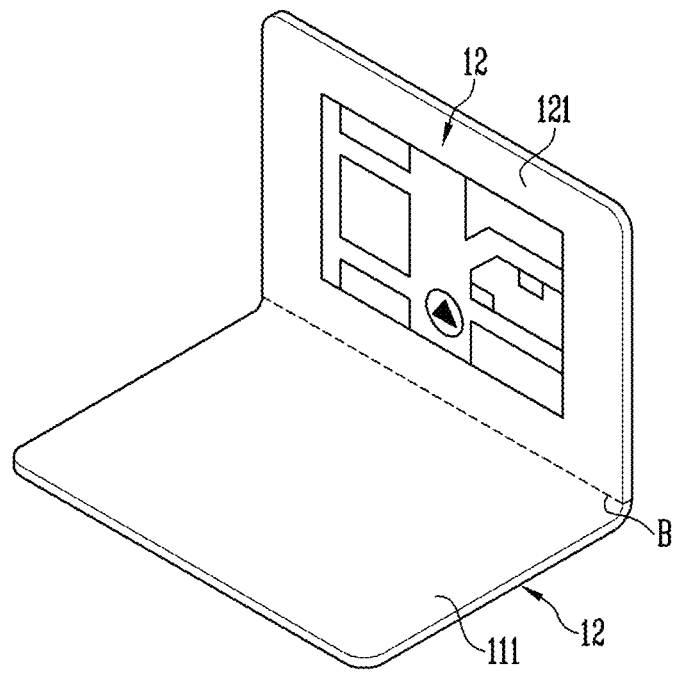

Referring to FIGS. 22 and 23, in embodiments of the disclosure, where the first display part 11 is the transparent part and the second display part 12 is the opaque part, the user may fold the boundary part B of the display device 1 in a way such that the first surface 111 of the first display part 11 and the first surface 121 of the second display part 12 form an acute angle. In one embodiment, for example, the angle between the first surface 111 of the first display part 11 and the first surface 121 of the second display part 12 may be in a range of about 40 degrees to about 60 degrees.

The user may rotate the display device 1 such that the second display part 12 is located upward of the first display part 11.

In an embodiment, the second display part 12 may display an arbitrary content image C selected by the user. The content image C may be, for example, multimedia, a picture, navigation, etc. While the content image C is being displayed on the second display part 12, the first display part 11 may display a user interface K corresponding to the displayed content image C. The user interface K may be, for example, a keyboard, a keypad, a gaming interface, etc.

The user may easily input information through the user interface K displayed on the first display part 11 while monitoring the content image C displayed on the second display part 12. Alternatively, the user may easily check the content image C displayed on the second display part 12, e.g., navigation in a state in which the first display part 11 is fixed to a deck or mounting device of a vehicle, etc.

In an embodiment, when a folding is sensed at the boundary part B, and it is sensed that the second display part 12 is placed on the top of the first display part 11, the display device 1 may display a content image C provided in an application being currently executed on the second display part 12, and control the first display part 11 and the second display part 12 such that a user interface K for the application is provided to or displayed on the first display part 11. In an embodiment, when a user interface corresponding to the content image C being currently displayed is not provided, any image may not be displayed on the first display part 11.

Various control methods of the display device 1 according to the disclosure are not limited to the above-described methods. In an embodiment, the display device 1 may control an image displayed on the first display part 11 and the second display part 12, using various methods, based on a folding angle at the boundary part B, a folding direction at the boundary part B, a stack structure of the first display part 11 and the second display part 12, an application being currently driven, etc.

Alternatively, where at least one of the first display part 11 and the second display part 12 is implemented to be flexible, the display device 1 may control an image displayed in the first display part 11 and the second display part 12, using various methods, based on angles, directions, numbers, etc. of foldings (or bendings) sensed in a region except the boundary part B.

In embodiments of the foldable display device and the manufacturing method thereof according to the disclosure, a user may easily and conveniently manipulate an electronic device through a folding operation of the foldable display device including the transparent part and the opaque part.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A method of manufacturing a display device, the method comprising:
   providing a dam on a carrier substrate;
   providing a first display part at one side of the dam and providing a second display part at the other side of the dam; and
   removing the carrier substrate and the dam,
   wherein one of the first display part and the second display part is transparent, and the other of the first display part and the second display part is opaque, and
   wherein a third part between the first display part and the second display part comprises a transparent part and an opaque part, which are mixed therein in a plan view.

2. The method of claim 1, wherein
   the dam incudes a plurality of pieces disposed in parallel to a boundary part between the first display part and the second display part, and
   the plurality of pieces is disposed in a mosaic shape in which the pieces are alternately provided to a left side and a right side.

3. The method of claim 1, wherein the providing the first display part at the one side of the dam and the providing the second display part at the other side of the dam includes:
   providing a base layer of each of the first display part and the second display part at the one side and the other side;
   providing a display panel of each of the first display part and the second display part at the one side and the other side; and
   providing a window layer of each of the first display part and the second display part at the one side and the other side.

4. The method of claim 3, further comprising:
   after the providing the display panel, providing an input sensing layer of the first display part at the one side.

5. The method of claim 3, further comprising:
   providing an input sensing layer on a bottom surface of the base layer of the first display part.

6. The method of claim 3, further comprising:
   after the providing the display panel, providing a polarizing layer of the first display part at the one side.

7. The method of claim 3, further comprising:
   providing a lower protective layer on a bottom surface of the base layer of the first display part.

8. The method of claim 1, wherein the removing the carrier substrate includes removing a portion of the carrier substrate corresponding to one of the first display part and the second display part.

9. A method of manufacturing a display device, the method comprising:
   providing a dam on a carrier substrate;
   providing a first display part at one side of the dam and providing a second display part at the other side of the dam; and
   removing the carrier substrate,
   wherein one of the first display part and the second display part is transparent, and the other of the first display part and the second display part is opaque,
   wherein the dam includes a plurality of pieces alternately disposed in a first oblique direction and a second oblique direction intersecting the first oblique direction with respect to a boundary portion between the first display part and the second display part.

* * * * *